United States Patent [19]
Lin

[11] Patent Number: 5,831,856
[45] Date of Patent: Nov. 3, 1998

[54] DRAM TESTING APPARATUS

[75] Inventor: Don Lin, Chung Li, Taiwan

[73] Assignee: Behavior Tech Computer Corp., Taipei, Taiwan

[21] Appl. No.: 897,515

[22] Filed: Jul. 21, 1997

[51] Int. Cl.[6] .............................. G06F 19/00; G01R 31/02
[52] U.S. Cl. ................................. 364/468.28; 324/158.1; 209/573
[58] Field of Search ......................... 364/468.28, 478.01, 364/478.07, 478.11, 479.01, 479.12; 324/158.1, 754; 209/571, 573, 908, 909; 221/10; 414/627; 438/10, 14

[56] References Cited

U.S. PATENT DOCUMENTS

| | | | |
|---|---|---|---|
| 4,760,924 | 8/1988 | Sato et al. ................................. | 209/573 |
| 5,686,834 | 11/1997 | Okudaira et al. ..................... | 324/158.1 |

*Primary Examiner*—Reba I. Elmore
*Assistant Examiner*—Steven R. Garland
*Attorney, Agent, or Firm*—Rosenberg, Klein & Bilker

[57] ABSTRACT

A dynamic random access memory (DRAM) testing apparatus includes a substantially upright support plate on which at least one elongated feeding chute is provided, having a channel co-extensive therewith for receiving and holding therein an IC bar which contains a number of DRAMs to be tested. The DRAMs are movable downward along the channel by means of gravity. A shifting mechanism, which is controlled by a control unit, sequentially transfers the DRAMs from the feeding chute to a testing device defining a holder for receiving the DRAM to carry out the test. The test is conducted by the control unit and the test result is transmitted thereto for classifying the DRAM being tested. The tested DRAM is then forwarded to a movable member to be conveyed thereby to a particular one of a plurality of out-feeding chutes which are associated with different classifications of the DRAMs. The DRAM is then moved from the out-feeding chute to an empty IC bars to be collected therein.

17 Claims, 6 Drawing Sheets

DRAM TESTING APPARATUS

FIELD OF THE INVENTION

The present invention relates generally to an apparatus for testing dynamic random access memory (DRAM) and in particular to a DRAM testing apparatus which is capable of automatically and sequentially testing a number of DRAMs contained in an elongated tube, which is usually referred to as IC bar, and classifying the tested DRAM in accordance with the test result thereof.

DESCRIPTION OF THE RELATED ART

With the development of computerization, the need and consumption of all kinds of electronic memory are significantly increased. One of the well known and commonly used electronic memories is the so called dynamic random access memory, commonly abbreviated as DRAM. Due to the increasing demand of the DRAM, the efficiency and cost of manufacturing the DRAM is becoming an important issue for the DRAM manufacturers. Before packed and sold, the DRAM have to be tested first to ensure proper performance thereof. Conventionally, the test of the DRAM is conducted manually. This is very in-efficient, making it impossible to cut down the manufacturing cost. Also, manual test may causes error(s) of the test result due to human factor.

Thus, it is desired to have an automatic apparatus to test and classify DRAM in a very time and cost efficient manner and to reduce the errors in testing the DRAM caused by human factor.

SUMMARY OF THE INVENTION

Therefore, a primary object of the present invention is to provide a DRAM testing apparatus which allows automatic testing operation on the DRAM so as to increase the manufacturing efficiency and avoid the errors caused by human factor encountered in the conventional manual testing operation.

Another object of the present invention is to provide a processor based DRAM testing apparatus for performing automatic testing operation on DRAM.

A further object of the present invention is to provide an automatic DRAM testing apparatus which may perform automatic test on a number of DRAMs in a sequential manner and to classify the tested DRAMs in accordance with the test result thereof.

Yet a further object of the present invention is to provide a DRAM testing apparatus which heats the DRAM to be tested to a temperature substantially the same as the nominal working temperature thereof before the DRAM is tested so as to provide a better assessment of the performance of the tested DRAM.

To achieve the above objects, in accordance with the present invention, there is provided a DRAM testing apparatus which comprises a substantially upright support plate on which at least one elongated feeding chute is provided, having a channel co-extensive therewith for receiving and holding therein an IC bar which contains a number of DRAMs to be tested. The DRAMs are movable downward along the channel by means of gravity. A shifting mechanism, which is controlled by a control unit, sequentially transfers the DRAMs from the feeding chute to a testing device defining a holder for receiving the DRAM to carry out the test. The test is conducted by the control unit and the test result is transmitted thereto for classifying the DRAM being tested. The tested DRAM is then forwarded to a movable member to be conveyed thereby to a particular one of a plurality of out-feeding chutes which are associated with different classifications of the DRAMs. The DRAM is then moved from the out-feeding chute to an empty IC bars to be collected therein.

The object, features and advantages of the present invention will be readily understood from the following description of a preferred embodiment thereof with reference to the accompanying drawings, wherein:

DETAILED DESCRIPTION OF THE PREFERRED EMBODIMENT

Figure 1:
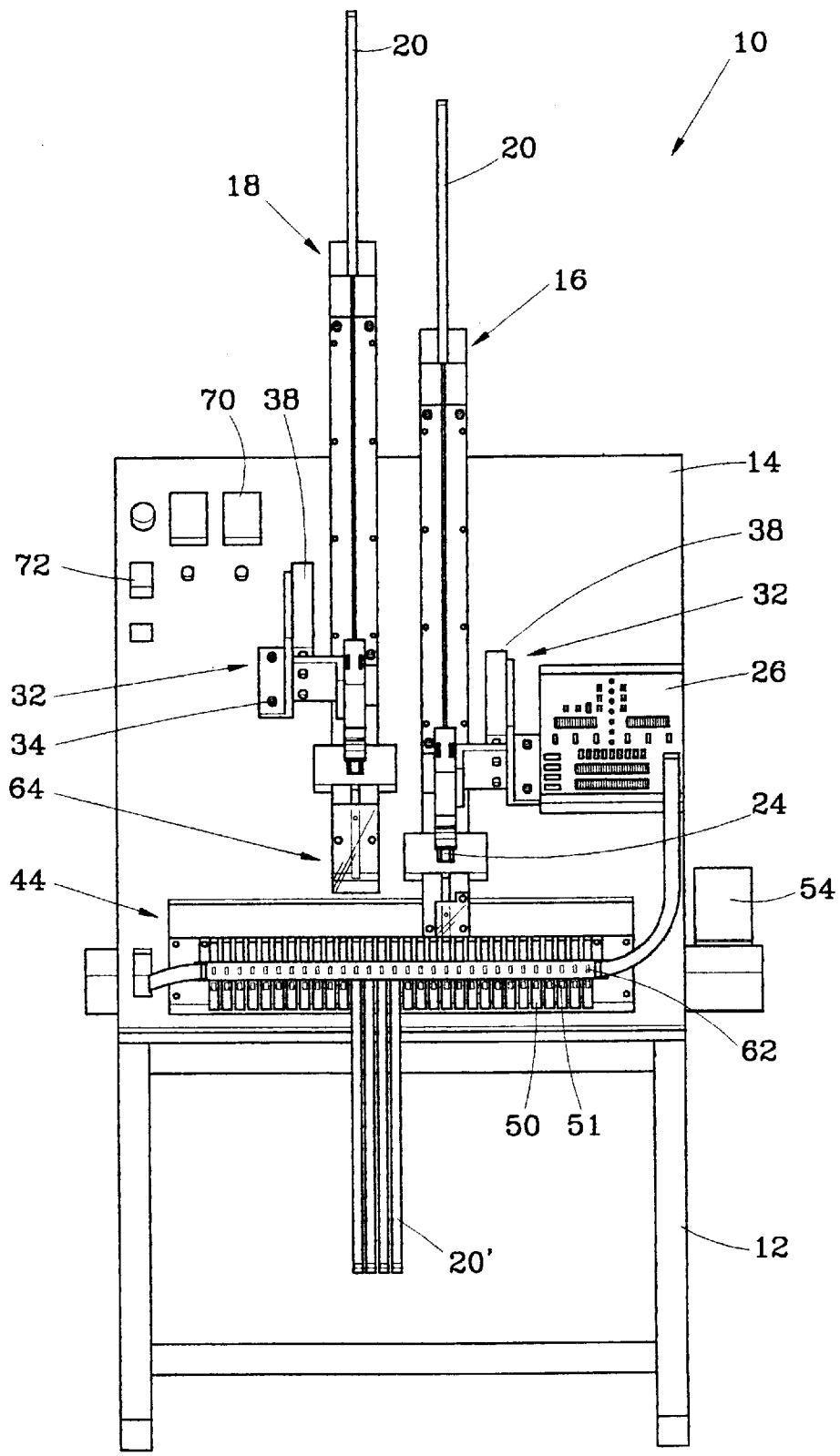
FIG. 1 is a front view showing a DRAM testing apparatus constructed in accordance with the present invention.
Figure 2:
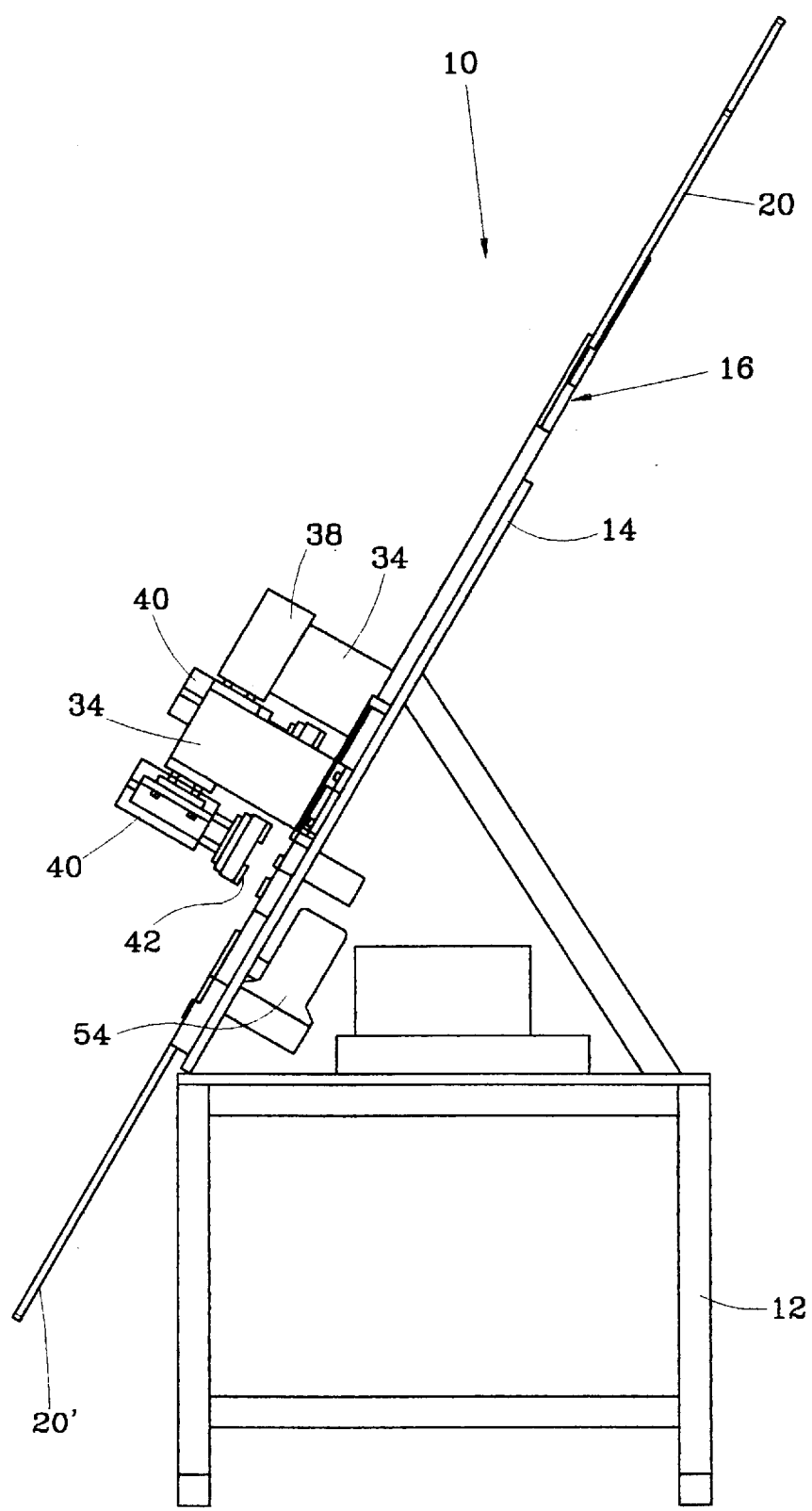
FIG. 2 is a side elevational view of the DRAM testing apparatus of the present invention.

The present invention will be described hereinafter in detail with reference to a preferred embodiment thereof illustrated in the drawings. Referring to the drawings and in particular to FIGS. 1 and 2, wherein a DRAM (dynamic random access memory) testing apparatus constructed in accordance with the preferred embodiment of the present invention, generally designated at 10, is shown, the DRAM testing apparatus 10 of the present invention comprises a frame 12 on which a support plate 14 is mounted at an inclined angle with respect to the horizontal, preferably greater than 45 degrees. The support plate is preferably arranged to be close to the vertical and approximately upright in order to make use of gravity for moving and feeding the DRAMs to be tested into the testing apparatus 10. This will be apparent from the following description.

Figure 6:
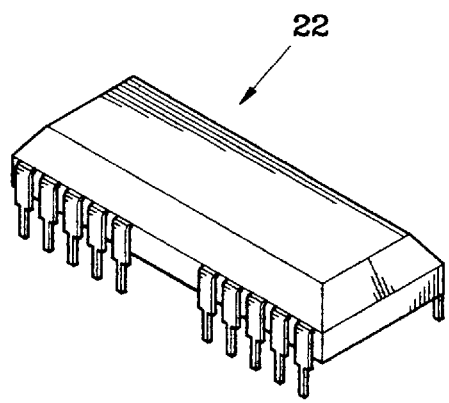
FIG. 6 is a perspective view showing a prior art DRAM chip which is adapted to be automatically tested in the DRAM testing apparatus of the present invention.

The support plate 14 has a front surface on which two elongated feeding chutes 16 and 18 (respectively referred to as first and second feeding chutes herein) are mounted, substantially extending in the vertical direction along the front surface. Each of the feeding chutes 16 and 18 has a channel co-extending therewith and having an upper opening for receiving the insertion of an IC bar 20 into the channel. The term "IC bar" used herein is referred to an elongated tubular member inside which IC devices, such as DRAMs in this case, for example that shown in FIG. 6 and designated at 22, are received and stacked over each other. Using such an elongated tube to contain IC devices is very common in the art and no further detail will be given herein.

Although it is shown that there are two such feeding chutes 16 and 18, it is also possible to use different numbers of the feeding chutes. For example, there may be only one or more than two such feeding chutes mounted on the support plate 14.

The channel of each of the feeding chutes 16 and 18 has a lower opening and an IC testing device, in the form of a holder 24 for the DRAM, located at the lower end of the feeding chute 16 or 18 to be in communication with the channel for receiving the IC devices 22 one by one from the IC bar 20 that is inserted into the channel. The test holder 24 holds the IC device 22 therein for proceeding with testing operation on the IC device 22. The holder 24 is electrically connected to a control unit 26 to perform the testing operation under the control of the control unit 26 and to transmit the test result of the IC device 22 to the control unit 26 which in turn classifies the IC device 22 in accordance with the test result. The control unit 26 may comprise a processor based controller, such as programmable logic control (PLC). The control unit 26 not only controls feeding the IC devices 22 to be tested into the holder 24 and the process of the test operation, but also classifies the IC devices tested in accordance with the test result thereof and conveying the tested IC devices to desired destinations in accordance with the classifications of the IC devices.

Figure 3:
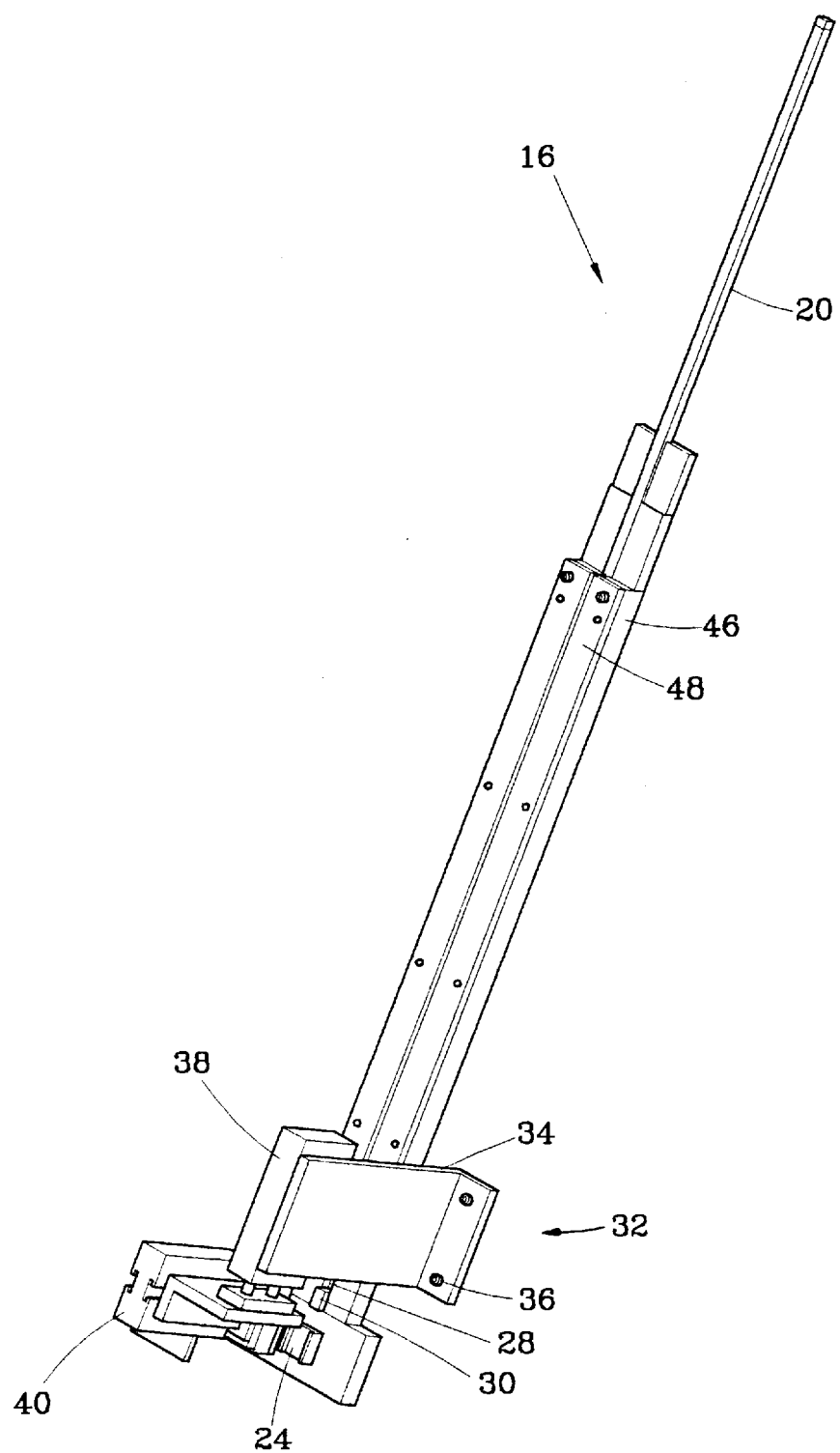
FIG. 3 is a perspective view showing the first feeding chute, as well as the shifting mechanism associated therwith, adapted in the DRAM testing apparatus of the present invention.

Referring now to FIGS. 3 and 4, which respectively and specifically show the first and second feeding chutes 16 and 18, each of the first and second feeding chutes 16 and 18, as shown previously, comprises a channel 28 (FIG. 4) co-extensive therewith from an upper opening to a lower opening for receiving and holding therein an IC bar 20 which contains a plurality of DRAMs 22 to be tested in a stacked fashion. The first and second chutes 16 and 18 are arranged to be substantially upright so that the IC bars 20 that are received within the channels 28 of the feeding chutes 16 and 18 are oriented substantially upright which allows the DRAMs 22 to move downward along the channels 28 of the chutes 16 and 18 under the action of gravity.

Figure 4:
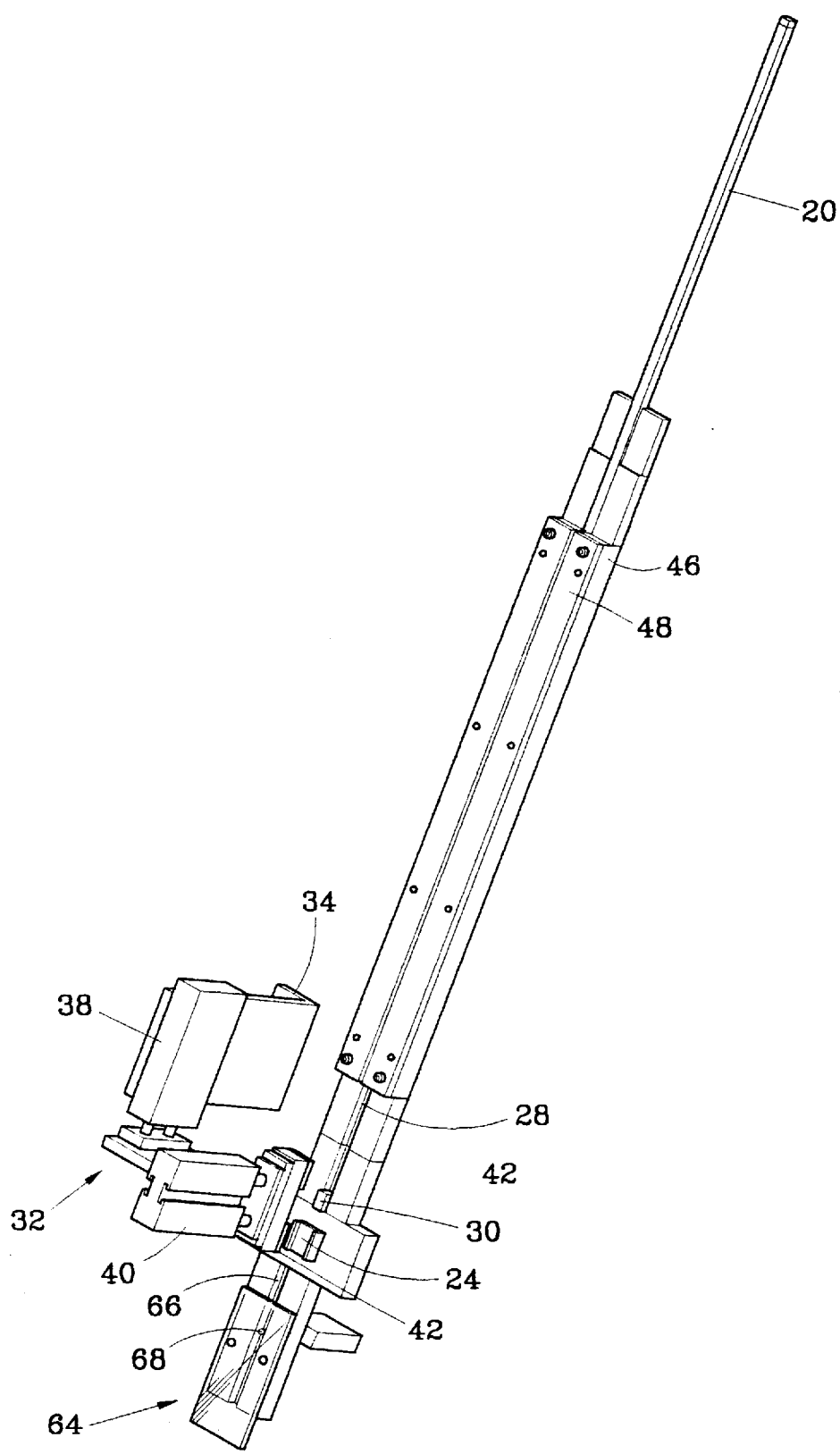
FIG. 4 is a perspective view showing the second feeding chute, as well as the shifting mechanism and the temporal DRAM receptacle associated therewith, adapted in the DRAM testing apparatus of the present invention.

As best shown in FIG. 4, each of the chutes 16 and 18 comprises a stop block 30 located at the lower opening thereof to temporarily stop the downward movement of the DRAMs 22 at a predetermined position which is referred to as "ready-to-feed position" herein. In accordance with a preferred embodiment of the present invention, the stop block 30 is located immediately above the holder 24, as shown in FIG. 4, so that all the DRAMs 22 to be tested are temporarily held at the ready-to-feed position above the holder 24. It should be noted that although the IC bar 20 is shown in FIG. 4, yet no DRAMs to be tested are shown for the purpose of clarity.

Each of the chutes 16 and 18 comprises a shifting mechanism 32, comprising a base 34 which is fixed on the support plate 14 of the apparatus 10 by means of for example screws or bolts 36 (FIG. 3). The base 34 has a first direction translation device 38 which provides translation in a first direction which, as used herein, is referred to a direction that is parallel with the length of the chute 16 or 18. The shifting mechanism 32 further comprises a second direction translation device 40 which is mounted on the first translation device 38 to be movable therewith in the first direction. The second direction translation device 40 itself provides translation in a second direction which is different from the first direction. In accordance with the preferred embodiment of the present invention, the second direction is substantially normal to the first direction as well as the support plate 14.

The second direction translation device 40 has two spaced vacuum suction cups 42 which are movable in both the first and second directions by being driven by the first direction translation device 38 and the second direction translation device 40. The vacuum suction cups 42 are in fluid communication with a vacuum source (not shown) in order to generate suction force in a controlled manner. The first direction translation device 38 and the second direction translation device 40 may be any type of known devices that provide controlled translation or linear movement, such as pneumatic cylinder or the like.

The shifting mechanism 32 is controlled by the control unit 26 to be moveable in the second direction relative to the support plate 14 and thus the DRAMs 22 supported thereon with the distance between the two suction cups 42 being such that when one of the cups 42 is aligned with the first one of the DRAMs 22 to be tested at the ready-to-feed position immediately above the stop block 30 (namely the lowest one of the DRAMs 22 in the channel 28 of the chute 16 or 18), the other one of the cups 42 is aligned with the test holder 24 (more precisely speaking the DRAM 22 held inside the holder 24) so that the first one of the DRAMs 22 at the ready-to-feed position and the DRAM 22 inside the holder 24 that has been tested may be picked up by the suction cups 42 at the same time. The movement of the suction cups 42 in the second direction allows the suction cups 42 to get close to and eventually in contact engagement with the DRAMs 22 to pick them up and then a reversed movement driven by the second direction translation device 40 brings the DRAMs 22 out of the chute 16 or 18 and the holder 24. The movability of the suction cups 42 in the first direction allows the DRAM 22 that is just brought out of the chute 16 or 18 to be moved toward the holder 24 by one of the cups 42 with the DRAM 22 that has just been tested carried by the other cup 42 toward a classification device 44 (see FIG. 5) to be further described. In this respect, the classification device 44 is located below the holder 24 to ensure a consistent movement of the two DRAMs 22 carried by the cups 42. The DRAMs 22 are then respectively put into the holder 24 and the classification device 44 by being moved in the second direction toward the support plate 14. By cutting off the suction force of the suction cups 42, the DRAMs 22 are released into the holder 24 and the classification device 44.

In accordance with the present invention, the first direction translation device 38, the second direction translation device 40 and the suction cups 42 are under the control of the control unit 26 in order to move and act in accordance with a predetermined sequence.

When the first one of the DRAMs 22 at the ready-to-feed position is moved away by the shifting mechanism 32, the second one automatically takes the position thereof under the action of gravity and ready to be forwarded into the holder 24 in the next shifting operation cycle.

In accordance with the present invention, preferably the chutes 16 and 18 are provided with heating devices 46 which heat the chutes 16 and 18, as well as the DRAMs 22 contained therein, to a predetermined temperature which corresponds to a nominal working temperature of the DRAMs 22 so that the performance of the DRAM so tested is more closely related to the actual operation performance thereof.

A thermal insulation material 48 may be coated or otherwise provided around the heating devices 46 to prevent personnel damage by the high temperature thereof.

Figure 5:
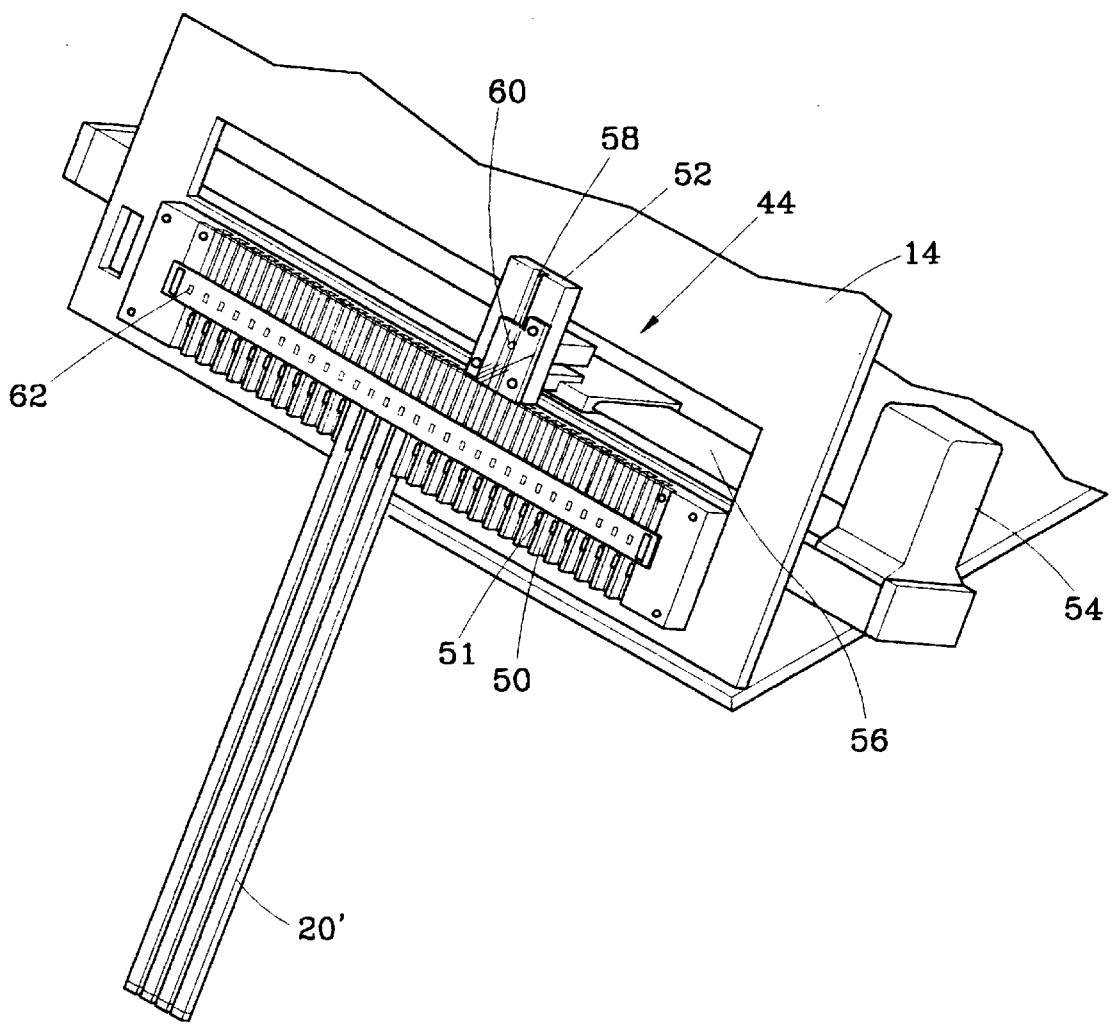
FIG. 5 is a perspective view showing the classification device adapted in the DRAM testing apparatus of the present invention.

The classification device 44 will be now described with reference to FIGS. 1, 2 and 5. As shown in FIG. 5, the classification device 44 comprises a plurality of out-feed chutes 50 which may be selectively and partially used in dispensing the DRAMs 22 that have been tested. In the embodiment illustrated, the out-feed chutes 50 are arranged to be substantially upright and extending along the support plate 14, preferably parallel with the feeding chutes 16 and 18, each comprising an outlet opening at the lower end thereof to receive the insertion of an empty IC bar which is designated at 20' for distinction from the IC bars 20 that are full of IC devices (or DRAMs). The empty IC bar 20' is to receive the DRAMs 22 that have been tested and classified in accordance with the test result thereof to fall within a particular class in association with the particular out-feed chute 50 that the empty IC bar 20' is inserted. Thus, each of the out-feed chutes 50 is associated with a particular class of the tested DRAMs 22 which is determined in accordance with the test result thereof. In the embodiment illustrated, there are only four empty IC bars 20' are shown, respectively associated with four classes of the tested DRAMs 22. Such a classification is determined in accordance with the test result of the DRAMs 22 on the basis of predetermined classification algorithm incorporated in the control unit 26. Since such an algorithm or the way how the DRAMs is classified or the criterion on which the classification is based is known and constitutes no novel parts of the present invention, no further detail will be given.

Each of the out-feed chutes 50 has a switch 51, such as a micro-switch, mounted therein to detect the insertion of the empty IC bars 20'. The micro-switches 51 are in electrical connection with the control unit 26 so as to allow the control unit 26 to identify those of the out-feed chutes 50 that have the IC bars 20' inserted therein.

The classification device 44 further comprises a movable member 52 which is movable, under the control of the control unit 26, along a linear path which allows the movable member 52 to be moved to and stop over at upper inlet openings of all the out-feed chutes 50, as well as the positions exactly below the holders 24 of the feeding chutes 16 and 18, which will be referred to as ready-to-dispense position herein, to allow the shifting mechanism 32 to transfer the DRAMs 22 that have been tested into the movable member 52. The linear movement of the movable member 52 may be provided by any known linear motion device, such as the linear motion along a linear rack 56 by being driven by an electrical motor 54, as illustrated in the drawings.

The movable member 52 comprises a channel or passage 58 extending therethrough, preferably and in the embodiment illustrated, in a direction substantially parallel to the first direction that is the direction the feeding chutes 16 and 18 and the out-feed chutes 50 extend. The passage 58 is to receive and temporarily hold the DRAMs 22 therein. A retractable stop pin 60 is provided inside the passage 58 in such a position as to have the DRAM 22 completely received inside the passage 58, while temporarily held therein. The stop pin 60 is controlled to retract when the movable member 52 is moved to and stops over the upper inlet opening of a particular one of the out-feed chutes 50 of which the predetermined classification is associated with the test result of the DRAM 22 that is carried by the movable member 52 to allow the DRAM 22 to be dispensed into the particular out-feed chute 50 which in turn guides the DRAM 22 into the empty IC bar 20'.

The stop pin 60 may be operated by for example a solenoid or a pneumatic cylinder which is in turn controlled by the control unit 26.

Each of the out-feed chutes 50 comprises a detector 62 in electrical connection with the control unit 26 to detect the movement of the DRAM 22 through the out-feed chute 50 so as to count the number of the DRAMs 22 that enter the associated IC bar 20' and to signal the control unit 26 to stop the operation once the IC bar 20' is full, until the IC bar 20' is replaced with a new and empty one. In accordance with the preferred embodiment of the present invention, the detector 62 comprises a photo-electrical sensor which generates a pulse each time a DRAM 22 passes therethrough. The sensor may also generates a step function signal when the IC bar 20' is full.

In operation, the DRAM 22 that has been tested in the test holder 24 of the feeding chute 16 or 18 is transferred to the movable member 52 by means of the shifting mechanism 32. The control unit 26 classifies the DRAM 22 that is being tested in accordance with the test result thereof and controls the movable member 52 to carry the DRAM 22 to a particular out-feed chute 50 associated with the classification of the DRAM 22 determined by the control unit 26. The stop pin 60 inside the passage 58 of the movable member 52 is retracted by the control unit 26 to allow the DRAM 22 to be dispensed by means of gravity into the out-feed chute 50 and eventually enters the associated IC bar 20'.

It has been observed that the time that is needed to test the DRAM is longer than that needed to move the DRAM to the out-feed chute so that a time interference may happen between the testing and dispensing operation of the two feeding chutes 16 and 18. However, to reduce the cost, only one movable member 52 is adapted in the embodiment illustrated and the single movable member 52 may not be capable to handle the DRAMs from the two holders 24 in time. To accommodate the difference in time, in accordance with the present invention, it is preferred that a temporal receptacle 64 is provided associated with and preferably below one of the two test holders 24. In the embodiment illustrated, the temporal receptacle 64 is provided associated with the test holder 24 of the second feeding chute 18, see FIG. 4.

To accommodate the receptacle 64, the second feeding chute 18 is located higher than the first feeding chute 16, as shown in FIG. 1, with the test holder 24 disposed immediately below the lower opening of the second feeding chute 18 so as to leave a space between the test holder 24 of the second feeding chute 18 and the path along which the movable member 52 moves to accommodate the receptacle 64.

The receptacle 64 has a structure similar to the movable member 52, but is fixed below the test holder 24 of the second feeding chute 18. The receptacle 64 comprises a passage 66 co-extensive therewith in the first direction for receiving the DRAM 22 transferred by the shifting mechanism 32 from the holder 24. A stop pin 68 which is retractable under the control of the control unit 26 is provided inside the passage 66 in such a location to allow the DRAM 22 to be completely received within the passage 66 for temporarily holding the DRAM inside the passage 66. The DRAM 22 is held inside the passage 66 until the movable member 52 has forwarded the DRAM from the test holder 24 of the first feeding chute 16 to a particular destination out-feed chute 50. The movable member 52 may then move to the ready-to-dispense position below the receptacle 64 to receive the DRAM 22 therefrom by retracting the stop pin 68 with the control unit 26 to allow the DRAM inside the receptacle 64 to slide down under the action of gravity. The movable member 52 then moves the DRAM 22 to a desired destination out-feed chute 50, as described previously.

Similar to the stop pin 60 of the movable member 52, the stop pin 68 of the receptacle 64 may be operated by for example a solenoid or a pneumatic cylinder which is in turn controlled by the control unit 26.

In addition, if desired, a sensor (not shown) for detecting the presence of DRAM inside each of the test holders 24 may be provided in the test holder 24 of each of the feeding chutes 16 and 18. Such a sensor may comprise photoelectrical device, such as an light emitting diode and a photo diode respectively mounted on two opposite sides of the test holder 24.

The DRAM testing apparatus 10 of the present invention may also include suitable meters and/or indicators to show the operation condition thereof, such as thermometer 70 for indicating the temperature of the feeding chutes 16 and 18 or a power-on switch 72 for turning on the apparatus 10. This is well known and thus there is no need for description.

The above description is made with respect to the preferred embodiment of the present invention and for those skilled in the art, it is possible to made a variety of modifications and changes to the embodiment without departing from the scope and spirit of the present invention. All these modifications and changes should be considered within the scope of the invention as defined in the appended claims.

What is claimed is:

1. A DRAM (dynamic random access memory) testing apparatus comprising:

a support plate, having a substantially upright surface;

at least one feeding device, mounted on the surface of the support plate for receiving a plurality of DRAMs to be test in such a manner to allow the DRAMs to sequentially move toward a ready-to-feed position by means of gravity;

a test holder located at a position corresponding to the at least one feeding device to receive the DRAMs one by one from the feeding device for performing a desired test operation on the DRAM so as to generate a test result associated with the DRAM that is being tested;

a control unit, in electrical connection with the test holder for controlling the test operation;

a shifting device comprises first grasping means, selectively engageable with/disengageable from the DRAMs, the shifting device being controlled by the control unit to be movable between a first position where the first grasping means is allowed to engage one of the DRAMs at the ready-to-feed position and a second position where the DRAM is allowed to be disposed into the test holder, the shifting device comprising second grasping means which is arranged to pick up the DRAM that is inside the test holder when the shifting device is at the first position, and to convey the DRAM that is picked up from the test holder to a ready-to-dispense position when the shifting device is at the second position; and a classification device comprising a plurality of out-feed chutes, each having an inlet opening and an outlet opening, the outlet opening being arranged to receive a DRAM collection container therein for receiving and collecting the DRAM that have been tested, a movable member which is movable between the ready-to-dispense position and the inlet openings of the out-feed chutes so as to receive the DRAM that has been tested from the second grasping means of the shifting device and move the DRAM to a specific one of the out-feed chutes which is associated with one of a number of classes of the DRAMs that are tested determined by the test result of the DRAM and thus allowing the DRAM to be collected within the DRAM collection container associated with the specific out-feed chute.

2. The DRAM testing apparatus as claimed in claim 1, wherein the support plate comprises a second feeding device mounted on the surface thereof for receiving therein a plurality of DRAMs which are sequentially moved to a ready-to-feed position of the second feeding device, the second feeding device comprising a second test holder and a second shifting device associated therewith, wherein the second feeding device comprises third grasping means for selectively engaging with/disengaging from the DRAMs, the second shifting device being controlled by the control unit to be movable between a third position where the third grasping means is allowed to engage one of the DRAMs at the ready-to-feed position of the second feeding device and a fourth position where the DRAM is allowed to be disposed into the second test holder, the second shifting device further comprising fourth grasping means which is arranged to pick up the DRAM that is inside the second test holder when the second shifting device is at the third position and to convey the DRAM that is picked up from the second test holder to a ready-to-dispense position of the second feeding device when the second shifting device is at the fourth position.

3. The DRAM testing apparatus as claimed in claim 2, wherein the second shifting device comprises first translation means for moving the third and fourth grasping means between the third position and the fourth position.

4. The DRAM testing apparatus as claimed in claim 3, wherein the second shifting device further comprises second translation means for moving the third and fourth grasping means toward/away from the DRAMs.

5. The DRAM testing apparatus as claimed in claim 2, wherein the second feeding device comprises, a DRAM temporal receptacle arranged at the ready-to-dispense position to temporarily hold the DRAM that is from the test holder of the second feeding device, the receptacle comprising an inlet for receiving the DRAM released from the shifting device and an outlet for releasing the DRAM into the movable member, a passage being connected between the inlet and the outlet with a retractable stop pin provided in the passage for holding the DRAM inside the passage, the stop pin being retractable by being controlled by the control unit to allow the DRAM to move through the passage and then released through the outlet.

6. The DRAM testing apparatus as claimed in claim 1, wherein the feeding device comprises a feeding chute arranged to extend along the surface of the support plate to be substantially upright for receiving therein the plurality of DRAMs in a stacked manner, the ready-to-feed position of the feeding device being defined by a stop block inside the chute which stops and supports the DRAMs at the ready-to-feed position when the DRAMs are moved by gravity toward the stop block.

7. The DRAM testing apparatus as claimed in claim 1, wherein the feeding device comprises a heating device arranged thereon to increase temperature of the DRAMs inside the device to be close to a working temperature of the DRAMs.

8. The DRAM testing apparatus as claimed in claim 7, wherein a layer of thermal insulation material is provided around the feeding chute to isolate the high temperature feeding chute and the heated DRAMs therein.

9. The DRAM testing apparatus as claimed in claim 1, wherein the shifting device comprises first translation means for moving the first and second grasping means between the first position and the second position.

10. The DRAM testing apparatus as claimed in claim 9, wherein the shifting device further comprises second translation means for moving the first and second grasping means toward/away from the DRAMs.

11. The DRAM testing apparatus as claimed in claim 1, wherein the shifting device comprises vacuum suction cups in fluid communication with a vacuum source by being controlled by the control unit to pick up/release the DRAMs.

12. The DRAM testing apparatus as claimed in claim 1, wherein the movable member of the classification device comprises a passage extending therethrough from an upper inlet opening for receiving the DRAM released from the shifting device and a lower outlet opening to dispense the DRAM into the associated one of the out-feed chute, the passage of the movable member comprising a retractable stop pin to temporarily hold the DRAM within the passage, the stop pin being retractable by being controlled by the control unit to dispense the DRAM from the outlet opening.

13. The DRAM testing apparatus as claimed in claim 1, wherein each of the out-feed chutes comprises a microswitch which is triggered when the DRAM collection container is connected to the out-feed chute to signal the control unit.

14. The DRAM testing apparatus as claimed in claim 1, wherein each of the out-feed chutes comprises a detector for detecting the DRAM passing through the out-feed chute so as to count the number of the DRAM entering the DRAM collection container through the out-feed chute.

15. The DRAM testing apparatus as claimed in claim 14, wherein the detector comprises a photo-electrical sensor which generates a pulse each time when one of the DRAMs passes therethrough for counting purpose and a step function signal when the DRAM collection container is full so as to signal the control unit to stop the operation.

16. The DRAM testing apparatus as claimed in claim 1, wherein the test holder comprises a photo-electrical sensor in connection with the control unit to detect the presence of the DRAM inside the test holder.

17. The DRAM testing apparatus as claimed in claim 1, wherein the out-feed chutes are arranged to juxtapose each other with the inlets aligned with each other along a substantially straight line which defines a path along which the movable member moves between the inlets of the out-feed chutes and the ready-to-dispense position of the feeding chute.

* * * * *